(12) United States Patent
Van De Kerkhof et al.

(10) Patent No.: US 8,233,134 B2
(45) Date of Patent: Jul. 31, 2012

(54) LITHOGRAPHIC APPARATUS AND DEVICE MANUFACTURING METHOD

(75) Inventors: Marcus Adrianus Van De Kerkhof, Helmond (NL); Siebe Landheer, Eindhoven (NL); Marcel Beckers, Eindhoven (NL); Jeroen Peter Johannes Bruijstens, Eindhoven (NL); Franciscus Johannes Joseph Janssen, Eindhoven (NL); Ivo Adam Johannes Thomas, Son (NL)

(73) Assignee: ASML Netherlands B.V., Veldhoven (NL)

( * ) Notice: Subject to any disclaimer, the term of this patent is extended or adjusted under 35 U.S.C. 154(b) by 800 days.

(21) Appl. No.: 12/237,583

(22) Filed: Sep. 25, 2008

(65) Prior Publication Data
US 2009/0103062 A1    Apr. 23, 2009

Related U.S. Application Data

(60) Provisional application No. 60/975,072, filed on Sep. 25, 2007, provisional application No. 60/996,654, filed on Nov. 28, 2007.

(51) Int. Cl.
*G03B 27/42* (2006.01)
*G03B 27/52* (2006.01)

(52) U.S. Cl. .......................... 355/30; 355/53

(58) Field of Classification Search .......... 355/30, 355/53
See application file for complete search history.

(56) References Cited

U.S. PATENT DOCUMENTS

| | | | |
|---|---|---|---|
| 4,509,852 A | 4/1985 | Tabarelli et al. | |
| 7,388,648 B2 | 6/2008 | Lof et al. | |
| 7,411,658 B2 | 8/2008 | Beckers et al. | |
| 7,697,111 B2 * | 4/2010 | Shirai et al. | 355/53 |
| 7,795,603 B2 | 9/2010 | Lof et al. | |
| 2004/0136494 A1 | 7/2004 | Lof et al. | |
| 2004/0207824 A1 | 10/2004 | Lof et al. | |
| 2006/0001851 A1 * | 1/2006 | Grant et al. | 355/53 |
| 2006/0038968 A1 | 2/2006 | Kemper et al. | |
| 2006/0158627 A1 | 7/2006 | Kemper et al. | |
| 2006/0209278 A1 * | 9/2006 | Kiuchi et al. | 355/53 |
| 2007/0081136 A1 * | 4/2007 | Hara | 355/53 |

(Continued)

FOREIGN PATENT DOCUMENTS

EP    1420300 A2    5/2004
(Continued)

OTHER PUBLICATIONS

Japanese Office Action mailed Feb. 8, 2011 in corresponding Japanese Patent Application No. 2008-239005.
(Continued)

*Primary Examiner* — Hung Henry Nguyen
*Assistant Examiner* — Steven H Whitesell Gordon
(74) *Attorney, Agent, or Firm* — Pillsbury Winthrop Shaw Pittman LLP

(57) ABSTRACT

A lithographic apparatus includes a projection system configured to project a patterned radiation beam onto a target portion of a substrate. The projection system has a final element. The apparatus also includes a barrier member surrounding a space between the projection system and, in use, the substrate, to define in part with the final element a reservoir for liquid. The barrier member is spaced from the final element to define a gap therebetween. The apparatus further includes a deformable seal between a radially outer surface of the final element and a radially outer surface of the barrier member. The deformable seal is configured to substantially prevent a gas from flowing past the seal towards or away from the reservoir of liquid.

18 Claims, 7 Drawing Sheets

U.S. PATENT DOCUMENTS

| | | |
|---|---|---|
| 2007/0126999 A1 | 6/2007 | Poon et al. |
| 2007/0188731 A1 | 8/2007 | Bezama et al. |
| 2007/0268469 A1 | 11/2007 | Fu et al. |
| 2007/0285645 A1* | 12/2007 | Schwertner et al. ............ 355/67 |
| 2008/0032234 A1 | 2/2008 | Mizutani |
| 2008/0106718 A1* | 5/2008 | Okada et al. .................... 355/67 |

FOREIGN PATENT DOCUMENTS

| | | |
|---|---|---|
| EP | 1477856 A1 | 11/2004 |
| EP | 1628163 A2 | 2/2006 |
| EP | 1670038 A1 | 6/2006 |
| EP | 1717628 A1 | 11/2006 |
| JP | 2004-165666 | 6/2004 |
| JP | 2004-304145 | 10/2004 |
| JP | 2006-114891 | 4/2006 |
| JP | 2006-128192 | 5/2006 |
| JP | 2007-110109 | 4/2007 |
| JP | 2007-142460 | 6/2007 |
| JP | 2007-184336 | 7/2007 |
| WO | 9949504 A1 | 9/1999 |
| WO | WO 2005020298 A1 * | 3/2005 |
| WO | 2005101121 A2 | 10/2005 |
| WO | WO 2006059636 A1 * | 6/2006 |
| WO | 2006078292 A1 | 7/2006 |

OTHER PUBLICATIONS

U.S. Appl. No. 12/222,123, filed Aug. 1, 2008, Beckers et al.

* cited by examiner

LITHOGRAPHIC APPARATUS AND DEVICE MANUFACTURING METHOD

This application claims priority and benefit under 35 U.S.C. §119(e) to U.S. Provisional Patent Application No. 60/975,072, filed Sep. 25, 2007, and U.S. Provisional Patent Application No. 60/996,654, filed Nov. 28, 2007, each of the foregoing applications incorporated herein in its entirety by reference.

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning structure, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning structure to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. The liquid may be distilled water (ultra pure water) although another high index liquid could be used. The description herein references a liquid e.g. a substantially incompressible and/or a wetting fluid. However, another fluid may be suitable, particularly a fluid with a higher refractive index than air, such as hydrocarbon, including but not limited to hydrofluorocarbon. The point of this is to enable imaging of smaller features since the exposure radiation will have a shorter wavelength in the liquid. (The effect of the liquid may also be regarded as increasing the effective NA of the system and also increasing the depth of focus.) Other immersion liquids have been proposed, including water with solid particles (e.g. quartz) suspended therein.

However, submersing the substrate or substrate and substrate table in a bath of liquid (see, for example, U.S. Pat. No. 4,509,852, hereby incorporated in its entirety by reference) means that there is a large body of liquid that must be accelerated during a scanning exposure. This requires additional or more powerful motors and turbulence in the liquid may lead to undesirable and unpredictable effects.

One of the solutions proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT Patent Application Publication WO 99/49504, hereby incorporated in its entirety by reference. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible; one example is illustrated in FIG. 3 in which four sets of an inlet with an outlet on either side are provided in a regular pattern around the final element.

A further immersion lithography solution with a localized liquid supply system is shown in FIG. 4. Liquid is supplied by two groove inlets IN on either side of the projection system PL and is removed by a plurality of discrete outlets OUT arranged radially outwardly of the inlets IN. The inlets IN and OUT can be arranged in a plate with a hole in its center and through which the projection beam is projected. Liquid is supplied by one groove inlet IN on one side of the projection system PL and removed by a plurality of discrete outlets OUT on the other side of the projection system PL, causing a flow of a thin film of liquid between the projection system PL and the substrate W. The choice of which combination of inlet IN and outlets OUT to use can depend on the direction of movement of the substrate W (the other combination of inlet IN and outlets OUT being inactive).

Another immersion lithography solution with a localized liquid supply system solution which has been proposed is to provide the liquid supply system with a barrier member (sometimes called an immersion hood) IH which extends along at least a part of a boundary of the space between the final element of the projection system and the substrate table. Such a solution is illustrated in FIG. 5. The barrier member is substantially stationary relative to the projection system in the XY plane though there may be some relative movement in the Z direction (in the direction of the optical axis). A seal is formed between the barrier member and the surface of the substrate.

Referring to FIG. 5, reservoir 11 forms a contactless seal to the substrate around the image field of the projection system so that liquid is confined to fill an immersion space between the substrate surface and the final element of the projection system. The reservoir is formed by a barrier member 12 positioned below and surrounding the final element of the projection system PL. Liquid is brought into the space below the projection system and within the barrier member 12 via inlet/outlet ducts 13. The barrier member 12 extends a little above the final element of the projection system and the liquid rises above the final element so that a buffer of liquid is provided. The barrier member 12 has an inner periphery that at the upper end, in an embodiment, closely conforms to the shape of the projection system or the final element thereof and may, e.g., be round. At the bottom, the inner periphery closely conforms to the shape of the image field, e.g., rectangular though this need not be the case.

The liquid is confined in the reservoir by a gas seal 16 between the bottom of the barrier member 12 and the surface of the substrate W. The gas seal is formed by gas, e.g. air or synthetic air but, in an embodiment, $N_2$ or another inert gas, provided under pressure via inlet 15 to the gap between barrier member 12 and substrate and extracted via first outlet 14. The overpressure on the gas inlet 15, vacuum level on the first outlet 14 and geometry of the gap are arranged so that there is a high-velocity gas flow inwards that confines the liquid. Such a system is disclosed in United States Patent Application Publication No. US 2004-0207824.

In European Patent Application Publication No. 1420300 and United States Patent Application Publication No. 2004-0136494, each of which is hereby incorporated in its entirety by reference, the idea of a twin or dual stage immersion lithography apparatus is disclosed. Such an apparatus is provided with two tables for supporting the substrate. Leveling measurements are carried out with a table at a first position, without immersion liquid. Exposure is carried out with a table at a second position, where immersion liquid is present. Alternatively, the apparatus may have only one table movable between exposure and measurement positions.

Providing an immersion liquid between the projection system and the substrate for the patterned radiation beam to pass through can present particular challenges. For example, with a barrier member, control of the level of liquid in the space may be difficult. Too much liquid may cause overflow. With too little liquid, bubbles may be incorporated in the liquid (reservoir) between the projection system and the substrate.

SUMMARY

In some immersion lithographic apparatus, there is a gap between the immersion system and the final element of the projection system (sometimes referred to as the WELLE lens). A free meniscus of the immersion liquid may be located in the gap. Typically, gas flows through the system for thermal conditioning. Some of the gas stream flows into the gap, over the immersion system, i.e. the liquid confinement system. An outer barrier may be used in an immersion system to prevent the gas stream from entering the gap, but in some apparatus, no outer barrier may be provided. However, the gas stream may disadvantageously cause the immersion liquid to evaporate, thereby applying a thermal load on the immersion system and the final projection system element. A thermal load may also be created from the movement of gas on an underside of the final projection system element as well. The thermal load may cause thermal (e.g., cold) spots in the final projection system element. Depending on the location of the meniscus, the thermal spots may be detected as an optical aberration that differs from a predicted aberration measurement, and/or may contribute to overlay/focus irregularity. In addition, immersion liquid may pass through this gap between the final projection system element and the immersion system, and some of the immersion liquid may escape through the gap.

During exposure, the substrate table is moved relative to the immersion system (and the projection system). This may cause the immersion liquid within the immersion system to move up the gap, e.g., in the direction of travel of the substrate. Thus, when the substrate is moved through a scanning or stepping motion, the direction of movement of the substrate changes. Because the immersion liquid in the gap moves with the movement of the substrate, the movement causes the local level of the immersion liquid in the gap to change. The movement of the immersion liquid is referred to as sloshing. If the movement is sufficiently large, the pressure on the immersion liquid may be sufficient to cause the liquid to overflow onto the top surface of the liquid confinement system. When the pressure decreases, liquid flows back into the gap, possibly taking with it unwanted contaminating particles present on the surface of the liquid confinement system. Thus, the liquid may be a source of defectivity and defects. Liquid may also be left on the top surface of the liquid confinement member, and on the surface of the final element. The remaining liquid may subsequently evaporate into the surrounding gas and thus apply a thermal load to the respective surfaces.

The presence of the immersion liquid on the top surface of the liquid confinement system may cause damping between the liquid confinement system and the projection system as the immersion system is moved in a direction towards the projection system. Such damping may also be called bridging and is undesirable, because it may decrease the performance of the apparatus.

It is therefore desirable, for example, to alleviate one or more of the aforementioned problems or one or more other problems, by having a way to reduce or minimize the heat load applied to the projection system and/or the immersion system. In an embodiment, that may be done by limiting the amount of gas that flows into the gap and to reduce the amount of evaporation of the immersion liquid.

According to an aspect of the invention, there is provided a lithographic apparatus that includes a projection system configured to project a patterned radiation beam onto a target portion of a substrate. The projection system has a final element. The apparatus also includes a barrier member surrounding a space between the projection system and, in use, the substrate, to define in part with the final element a reservoir for liquid. The barrier member is spaced from the final element to define a gap therebetween. The apparatus further includes a deformable seal between a radially outer surface of the final element and a radially outer surface of the barrier member. The deformable seal is configured to substantially prevent a gas from flowing past the seal towards or away from the reservoir of liquid.

According to an aspect of the present invention, there is provided a device manufacturing method that includes projecting a patterned beam of radiation from a projection system through an immersion liquid onto a target portion of a substrate, and confining the immersion liquid in a space between the projection system and the substrate using a final element of the projection system and a barrier member surrounding the space. The method also includes substantially preventing a gas from flowing past a deformable seal between a radially outer surface of the final element and a radially outer surface of the barrier member.

According to an aspect of the present invention, there is provided a lithographic apparatus that includes a projection system configured to project a patterned radiation beam onto a target portion of a substrate. The projection system has a final element. The apparatus also includes a barrier member that surrounds a space between the projection system and, in use, the substrate, to define in part with the final element a reservoir for liquid. The barrier member is spaced from the final element to define a gap therebetween. The apparatus further includes a deformable seal between a radially outer surface of the final element and a radially outer surface of the barrier member. The deformable seal is configured to substantially prevent a gas from entering or leaving the gap between the final element and the barrier member and contacting the liquid.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
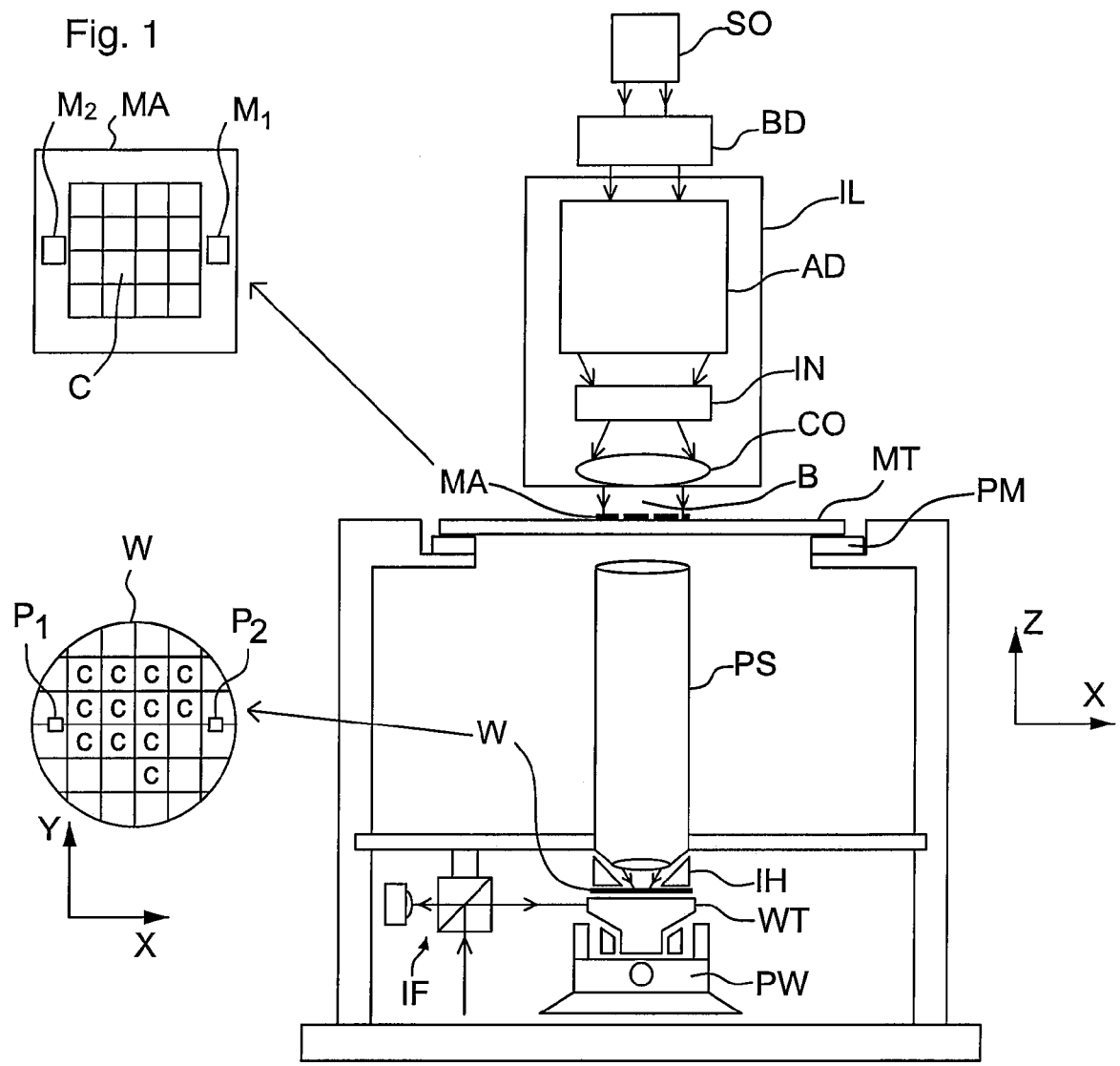
FIG. 1 depicts a lithographic apparatus according to an embodiment of the invention.
Figure 2:
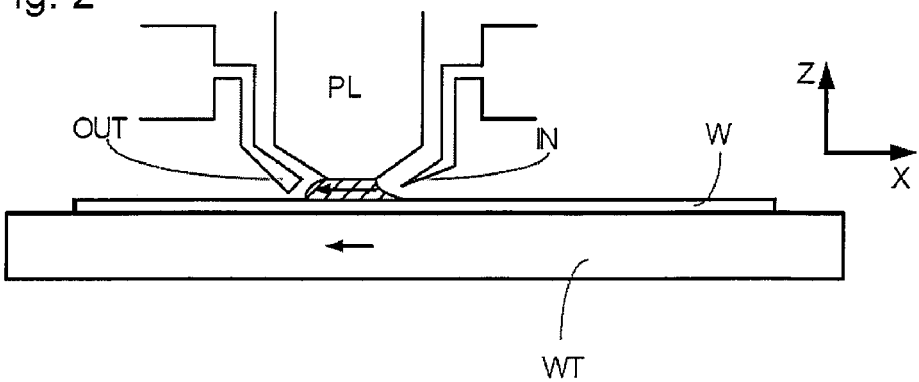
FIGS. 2 and 3 depict a liquid supply system for use in a lithographic projection apparatus.
Figure 3:
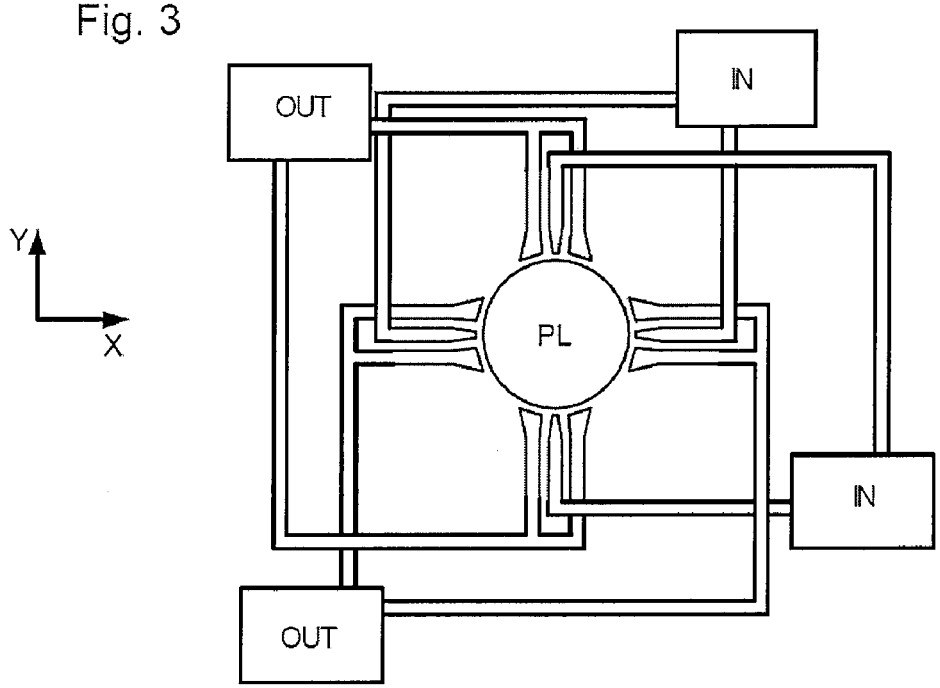
Figure 4:
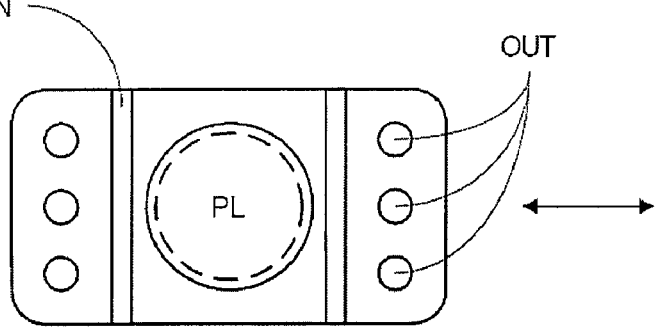
FIG. 4 depicts another liquid supply system for use in a lithographic projection apparatus.
Figure 4:
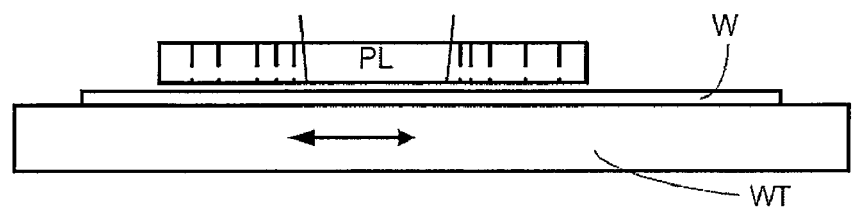

FIG. 1 schematically depicts a lithographic apparatus according to one embodiment of the invention. The apparatus comprises an illumination system (illuminator) IL configured to condition a radiation beam B (e.g. UV radiation or DUV radiation); a support structure (e.g. a mask table) MT constructed to support a patterning structure (e.g. a mask) MA and connected to a first positioner PM configured to accurately position the patterning structure in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning structure MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning structure in a manner that depends on the orientation of the patterning structure, the design of the lithographic apparatus, and other conditions, such as for example whether or not the patterning structure is held in a vacuum environment. The support structure can use mechanical, vacuum, electrostatic or other clamping techniques to hold the patterning structure. The support structure may be a frame or a table, for example, which may be fixed or movable as required. The support structure may ensure that the patterning structure is at a desired position, for example with respect to the projection system. Any use of the terms "reticle" or "mask" herein may be considered synonymous with the more general term "patterning structure."

The term "patterning structure" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning structure may be transmissive or reflective. Examples of patterning structures include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system."

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning structure (e.g., mask) MA, which is held on the support structure (e.g., mask table) MT, and is patterned by the patterning structure. Having traversed the patterning structure MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning structure MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning structure MA and substrate W may be aligned using patterning structure alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning structure MA, the patterning structure alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning structure, and the substrate table WT is moved or scanned while a pattern imparted to the radiation beam is projected onto a target portion C. In this mode, generally a pulsed radiation source is employed and the programmable patterning structure is updated as required after each movement of the substrate table WT or in between successive radiation pulses during a scan. This mode of operation can be readily applied to maskless lithography that utilizes programmable patterning structure, such as a programmable mirror array of a type as referred to above.

Combinations and/or variations on the above described modes of use or entirely different modes of use may also be employed.

Figure 6:
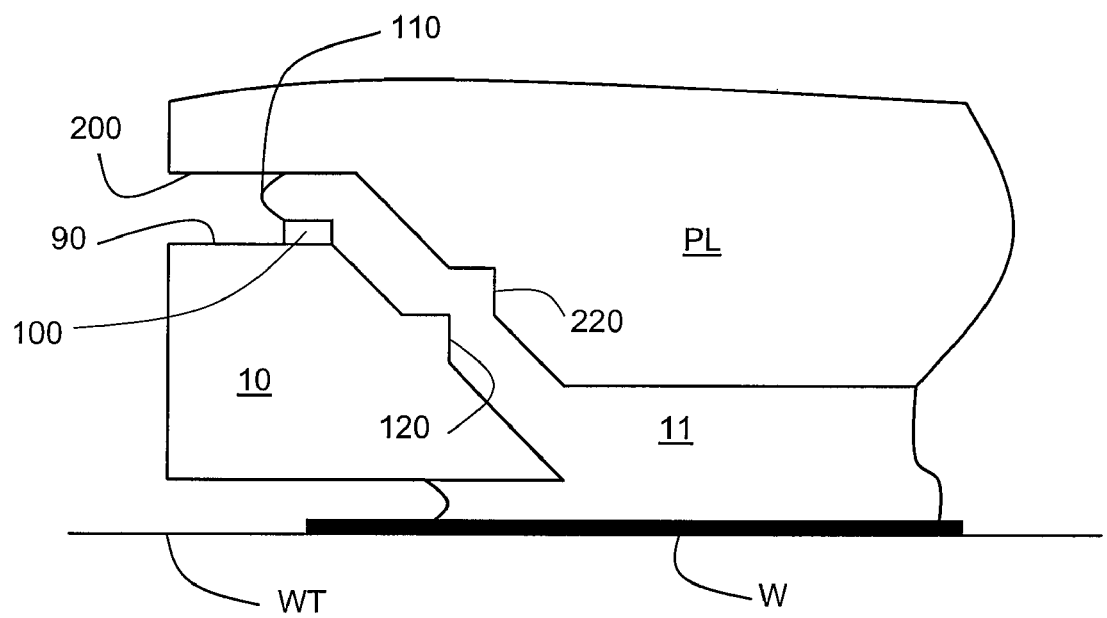
FIG. 6 depicts, in cross-section, a liquid confinement system for use in a lithographic apparatus.

FIG. 6 illustrates, in cross-section, a liquid supply system that includes a barrier member 10 which at least partly or completely surrounds a space between the projection system PL and the substrate W and has a barrier surface that defines, along with the projection system PL and the substrate W (and/or the substrate table WT), a reservoir for the liquid 11. In this way, liquid 11 can be provided in that space so that the patterned radiation beam that is projected through the projection system PL onto the substrate W passes through the liquid 11.

The barrier member 10 may be generally shaped to conform to the outer shape of the projection system PL such that a constant gap exists between the projection system PL and the barrier member 10. A gap is present in order that independent relative movement of the projection system PL and barrier member 10 is possible.

In an embodiment, measures may be taken in order to deal with variations in the volume of the reservoir and variations in liquid supply/extraction from the reservoir. Under normal conditions, the top surface of the liquid 11 has a meniscus which is substantially stationary relative to the projection system and the barrier member 10. The top surface 90 of the barrier member 10 is a horizontal surface. If the immersion liquid level changes due to, for example, substrate motion, and the meniscus is on the top surface 90, there is a risk of overflow of the barrier member 10. In order to prevent this, a protrusion 100 may be provided on the top surface 90 of the barrier member 10 at an inner most edge of the barrier member. The protrusion 100 may extend around the barrier member 10 and thus may form a ring or other enclosing shape. The protrusion 100 may be closer to the surface of the projection system PL, in particular the horizontal surface 200 of the projection system PL, than parts of the barrier member 10 surrounding the protrusion 100.

In an embodiment, there may be a step change in distance from between the protrusion 100 and the projection system PL to between the barrier member 10 and the projection system PL. This step change can be seen on the left hand side of the protrusion 100 in FIG. 6. In an embodiment, this step change is on the radially outward side of the protrusion 100 but may also or optionally be present on the radially inward side of the protrusion 100 as is the case in FIG. 6. This geometry means that in order for the meniscus of the top of the liquid 11 to pass the protrusion 100, the length of the meniscus will need to increase, as represented by 110 in FIG. 6, which may require a great deal of energy. In an embodiment, surfaces of both the protrusion 100 and the projection system PL in the region of the protrusion may be formed of liquidphobic materials (e.g., the liquid makes a contact angle with those surfaces of generally greater than 90° but less than 180°, e.g., 100°, 110°, 120°, etc.) such that the shape of the meniscus 110 is convex when viewed from outside of the liquid. In an embodiment, the surfaces of one or both of the protrusion 100 and the projection system PL in the region of the protrusion may be formed of a liquid repellent material.

Thus, the provision of a step increase in the distance between the surface of the projection system PL and the barrier member 10 in a radially outward direction may significantly decrease the chances of overflow when using a barrier member 10.

The protrusion 100 is illustrated as being on the barrier member 10. However, this need not be the case and the protrusion may be on the projection system, so long as the same function (i.e. providing an energy barrier for the meniscus to overcome to move past the protrusion) is fulfilled.

Also illustrated in FIG. 6 is an embodiment of a system in which the inner surface of the barrier member 10 facing the projection system PL is deliberately misformed such that it more closely resembles the outer surface of the projection system PL which may also be deliberately misformed. In this way, a labyrinth is created for the liquid 11 to flow up towards the protrusion 100 from the substrate and this increases the flow restriction and thereby decreases the risk of overflowing. Thus, the path which the liquid would need to take in order to overflow over the barrier 10 would be tortuous and require at least three changes of direction. In the illustrated embodiment, this may be achieved by the provision of an indentation 220 in a side wall of the projection system PL. A protrusion 120 may be provided on the inner side wall of the barrier member 10 (in the barrier surface), and may be formed by a single or multiple elements. Other measures can also be taken in order to increase the tortuousness of the path for liquid to follow from a position between the projection system PL and the substrate W to the top of the barrier member 10. The indentation 220 and/or protrusion may be used with or without the protrusion 100, and with or without the liquidphobic coatings discussed in greater detail below.

Figure 7:
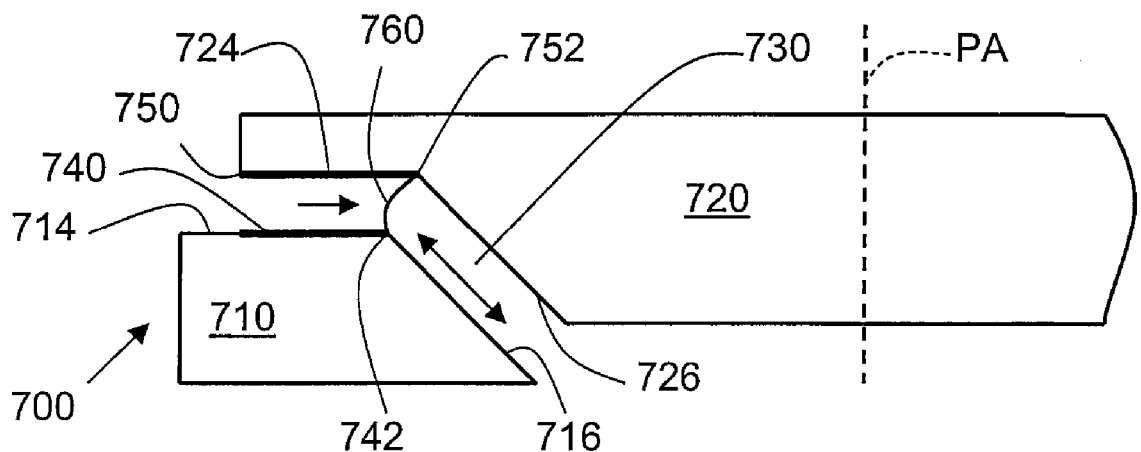
FIG. 7 depicts, in cross-section, a liquid confinement system for use in a lithographic apparatus.

FIG. 7 illustrates an embodiment of a liquid confinement system 700 that is configured to substantially confine immersion fluid to a desired volume between the projection system and the substrate. The liquid confinement system may be part of the liquid supply system described above. The immersion fluid is desirably a liquid that has a refractive index that is substantially/approximately/about equal to or greater than the refractive index of pure water. The liquid confinement system 700 includes a barrier member 710 having a radially outer surface, i.e., a surface that is located radially outward from a projection axis PA of the beam of radiation that is projected by the projection system PS, as described above in reference to FIG. 1. The radially outer surface of the barrier member 710 includes a substantially horizontal top surface 714 and an inclined top surface 716 that is inclined relative to the horizontal top surface 714 and the projection axis PA. The barrier member 710 is spaced from a final element 720 of the projection system so as to define a gap 730 therebetween. The final element 720 may be the final element of the entire projection system, or the final element may be the final element of an intermediate projection system that is in contact with liquid. The final element 720 includes a radially outer surface (i.e., a surface that is located radially outward from a projection axis PA) that includes a substantially horizontal surface 724 that is opposite the substantially horizontal top surface 714 of the barrier member 710, and an inclined surface 726 that is opposite the inclined surface 716 of the barrier member 710. The lower surface of the final element 720 and the top surface of the barrier member 710 may be shaped to cooperate with each other.

In the embodiment shown in FIG. 7, in either in place of or in addition to the protrusion 100 discussed above, a liquid repellent (e.g., liquidphobic or hydrophobic, when the immersion liquid is water) external layer 740, which may be in the form of a coating, may be applied to the top surface of the immersion system (e.g., the barrier member 710 of the liquid confinement system 700). In an embodiment, the barrier member 710 may be made from a liquidphobic material that provides a liquid repellent surface. The term "layer" as used herein should be broadly construed to include a surface that is an integral part of the member as well as a surface that is provided in the form of a coating and is thus not necessarily an integral part of the member.

During sloshing, represented by the double headed arrow in FIG. 7, this external layer 740 can help prevent the immersion liquid from accessing the substantially horizontal top surface 714 of the barrier member 710, which may reduce the quantity of contaminant particles found in the immersion liquid in the reservoir. One end of a meniscus 760 of the immersion liquid may be pinned to an edge 742 of the external layer 740 due to a step function change in surface properties at the edge 742. In other words, because the contact angle between the immersion liquid and the external layer 740 is greater than 90 degrees (e.g., 100°, 110°, 120°, etc., up to 180°), and the contact angle between the surface of the barrier member 710 that does not include the external layer 740 is less than about 90 degrees (e.g., 80°, 70°, 60°, etc. down to 0°), thereby creating a step function change, the meniscus 760 is not likely to rise above the edge 742. The term "edge" as used herein is intended to describe an end of the external layer 740 that is closest to the immersion liquid reservoir that is contained in between the projection system and the substrate, without imparting any particular physical structure or shape.

If the dynamic force acting on the immersion liquid is sufficiently great, for example, during movement of the substrate table, liquid can break free of its pinning, and escape onto the external layer 740. However, because of the properties of the layer 740, the layer 740 may repel the liquid, desirably back beyond the edge 742 of the layer 740. Substantially no immersion liquid may be allowed to remain on the external layer 740, thereby reducing the evaporation and thermal load applied to the apparatus.

As shown in FIG. 7, the substantially horizontal surface 724 of the radially outer surface of the final element 720 may also include a liquidphobic external layer 750 that is configured to repel liquid. In the illustrated embodiment, the external layer 750 has an edge 752 that is located at or near an intersection of the substantially horizontal surface 724 and the inclined surface 726 of the final element 720. The location of the edge 752 of the external layer 750 of the final element 720 relative to the edge 742 of the external layer 740 of the barrier member 710 may allow the meniscus 760 of the immersion liquid to also be pinned at the edge 752.

The external layers 740, 750 may include any suitable liquidphobic material. For example, in an embodiment, the external layers 740, 750 may include polytetrafluoroethylene, e.g., TEFLON®. The external layers 740, 750 may be applied to their respective surfaces in the form of a coating or may be applied with a sticker or laminating material that includes such a coating.

Figure 8:
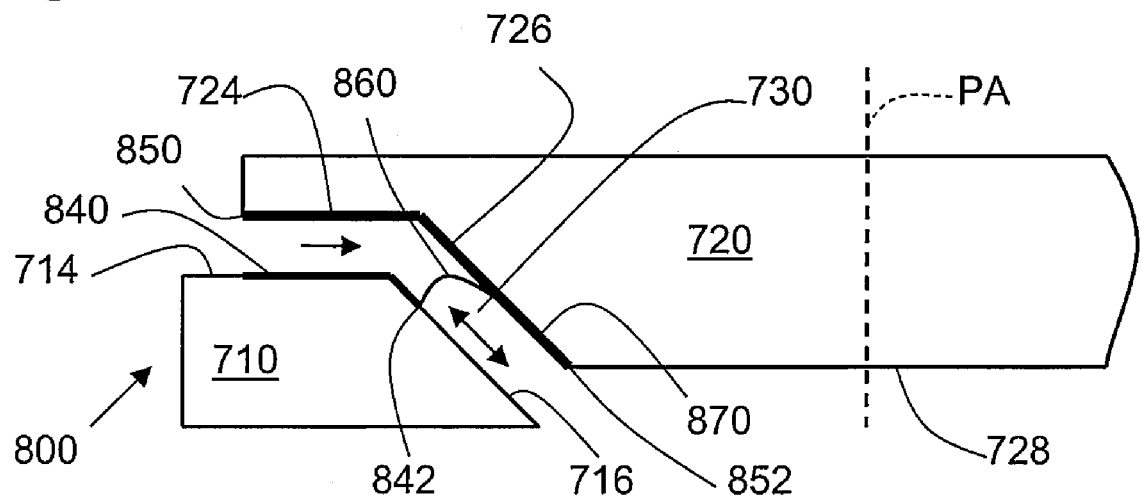
FIG. 8 depicts, in cross-section, a liquid confinement system for use in a lithographic apparatus.

FIG. 8 illustrates an embodiment of a liquid confinement system 800 that includes a liquidphobic external layer 840, which may cover the substantially horizontal surface 714, as well as a portion of the inclined top surface 716 of the barrier member 710. One end of a meniscus 860 of the immersion liquid may be pinned to an edge 842 of the external layer 840, which is located on the inclined surface 716.

As shown in FIG. 8, the substantially horizontal surface 724 as well as the inclined surface 726 of the radially outward surface of the final element 720 may also include a liquidphobic external layer 850 that is configured to repel liquid. As illustrated, the external layer 850 has an edge 852 that is located at an intersection of the inclined radially outward surface 726 and a bottom substantially horizontal surface 728 of the final element 720 (i.e., at the bottom of the inclined surface 726). One end of the meniscus 860 of the immersion liquid may be pinned to the edge 852 of the external layer 850, which is located at the bottom of the inclined surface 726, if the level of the immersion liquid in the reservoir is sufficiently low. Otherwise, one end of the meniscus 860 may move up the inclined surface 726, but the contact angle will be such that a thin film of the immersion liquid may not form on the surface 726, which may reduce the amount of immersion liquid that may evaporate, thereby reducing cold spots on the final element.

As illustrated in FIG. 8, the final element 720 may also include an ultra-violet ("UV") absorbent layer 870 that is provided in between the surface of the final element 720 itself and the external layer 850. The UV absorbent layer 870 is desirably provided as a coating. The UV absorbent layer 870 may be applied to the surface of the final element 720 prior to application of the external layer 850, such that the UV absorbent layer 870 is in between the final element 720 and the external layer 850. The UV absorbent layer may prevent unwanted radiation from reaching each of the external layers 850, 840 on the final element 720 and the barrier member 710, respectively, and may protect and lengthen the life of the external layers 840, 850, particularly if the external layers 840, 850 are UV susceptible. The UV absorbent layer 870 may not be liquidphobic, or may not be liquidphobic to the same extent as the surface of the external layer 850 that is provided on the final element 720. In an embodiment, the UV absorbent layer may have a liquidphilic surface property. Of course, liquidphobic materials that are not adversely affected by UV radiation may be applied directly to the final element without the use of the UV absorbent layer, as described above.

In the embodiment illustrated in FIG. 8, the UV absorbent layer 870 at least covers the same area of the surface of the final element 720 as the external layer 850. The UV absorbent layer 870 may also be placed at other parts of the lithographic apparatus to protect the external layers 840, 850. Because UV radiation may reflect and refract within the projection system and the immersion system, scattering as stray radiation through the immersion liquid, it may be beneficial for the UV absorbent layer 870 to cover the maximum possible surface of the final element 720, without obscuring the path of the exposure beam, to prevent unwanted reflection and refraction of the projected radiation. Otherwise, stray radiation may interact with the external layers 840, 850, and the life of the external layers 840, 850 may be reduced. The effect of the UV absorbent layer 770 may be maximized if the UV absorbent layer 770 is provided to the substantially horizontal radially outward surface 724 of the final element 720 and the inclined radially outward surface 726 of the final element 720 as well.

Figure 9:
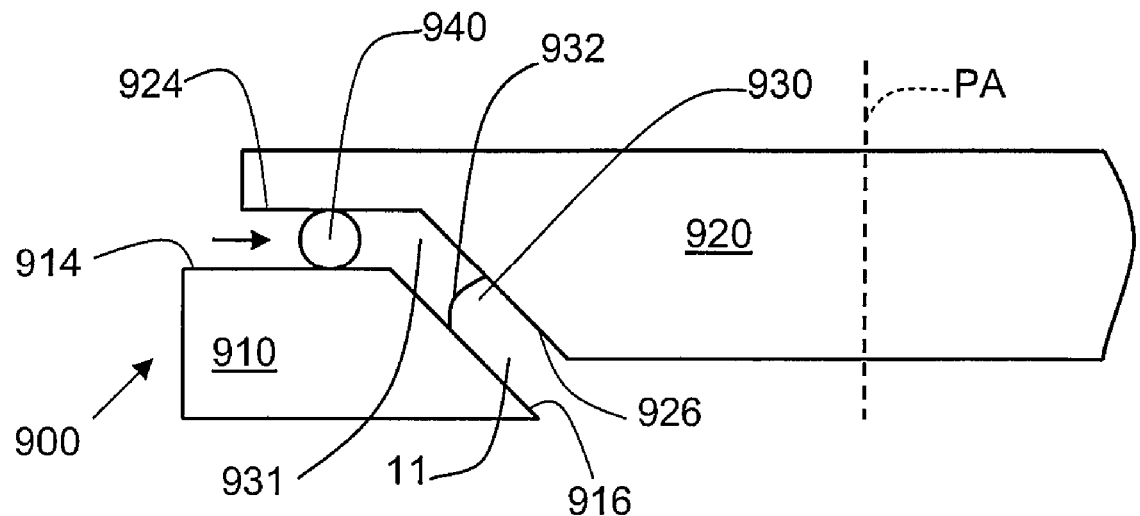
FIG. 9 depicts a cross-section of a deformable seal between a liquid confinement system and a final element of a projection system of the apparatus of FIG. 1 according to an embodiment of the invention.

FIG. 9 illustrates an embodiment of a liquid confinement system 900 that includes a barrier member 910 having a radially outer surface, i.e., a surface that is located radially outward from the projection axis PA of the beam of radiation. The radially outer surface of the barrier member 910 includes a substantially horizontal top surface 914 and an inclined top surface 916 that is inclined relative to the horizontal top surface 914 and the projection axis PA. The barrier member 910 is spaced from a final element 920 of the projection system so as to define a gap 930 therebetween. The final element 920 may be the final element of the entire projection system, or the final element may be the final element of an intermediate projection system that is in contact with liquid. The final element 920 includes a radially outer surface (i.e., a surface that is located radially outward from a projection axis PA) that includes a substantially horizontal surface 924 that is opposite the substantially horizontal top surface 914 of the barrier member 910, and an inclined surface 926 that is opposite the inclined surface 916 of the barrier member 910. The lower surface of the final element 920 and the top surface of the barrier member 910 may be shaped to cooperate with each other.

As shown in FIG. 9, the lithographic apparatus also includes a deformable seal 940 that is in between the barrier member 910 and the final element 920. More specifically, the deformable seal 940 is in between the horizontal top surface 914 of the barrier member 910 and the horizontal surface 924 of the final element 920. Although the deformable seal 940 is shown to be in contact with both horizontal surfaces 914, 924, such contact with both surfaces 914, 924 is not required. For example, the deformable seal 940 may be supported by the horizontal surface 914 of the barrier member, and a small gap may exist between the deformable seal 940 and the final element 920, thereby forming a leaking seal. If the barrier member 910 is moved towards the final element 920, the deformable seal 940 may contact the final element 920 and deform (i.e., compress), if the distance between the barrier member 910 and the final element 920 becomes less than the thickness of the deformable seal 940. Such an arrangement may prevent damage to the barrier member 910, the final element 920, as well as the deformable seal 940. In an embodiment, the deformable seal 940 may be constructed and arranged to allow the liquid 11 to exit the gap 930 if the level of the liquid rises to an overflow level. In other words, the deformable seal 940 may also deform so that the liquid may flow around the deformable seal 940.

The deformable seal 940 may be made from a resilient and/or flexible material, including but not limited to a rubber, an elastomer, and/or a polymeric material, and may be of any suitable shape. For example, the deformable seal 940 may be annular-shaped, such as in the shape of a ring that surrounds the final element 920, and may have a substantially circular cross-sectional shape, as illustrated. Other embodiments of annular-shaped seals may have a shape of a square, or any other multi-sided shape, both in terms of its overall configuration, as well as its cross-section. In an embodiment, the deformable seal 940 may include a spring disk or any other type of flexible structure that is configured to substantially seal the gap between the barrier member 910 and the final element 920 to substantially prevent a gas, such as air, (represented by the horizontal arrow in FIG. 9) from entering the gap 930. Examples of suitable deformable seals of this embodiment include, but are not limited to an O-ring, a C-ring, a Z-ring, and a bellows-like ring (in cross section).

By substantially preventing gas from entering the gap 930, a gas 931 that is in between the deformable seal 940 and the liquid 11 may become saturated with vapor from the liquid so that the gas 931 is in thermal equilibrium with the liquid 11. This may substantially reduce the amount of liquid that is evaporated due to a meniscus 932 of the liquid 11 being exposed to an unsaturated gas. The seal created by the deformable seal 940 need not be gas-tight, rather, the seal may be a leaking seal such that a small amount of gas may leak into the gap and/or the saturated gas 931 may leak out of the gap 930. In an embodiment, the gas 931 may include a gas having a high partial pressure of inert gas, such as a noble gas or nitrogen, and a low partial pressure of oxygen. Providing a gas having a low partial pressure of oxygen to the gap may prevent oxygen from dissolving in the liquid 11 and being absorbed by the beam of radiation that is projected by the projection system. Such a gas may be provided to the gap via one or more suitable conduits (not shown) in the barrier member 910.

Figure 10:
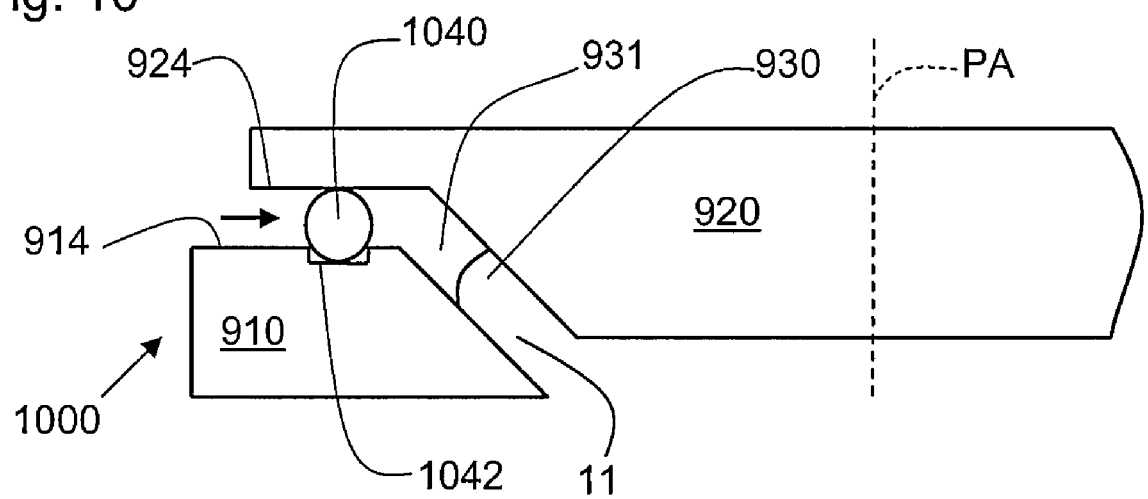
FIG. 10 depicts a cross-section of a deformable seal between the liquid confinement system and the final element according to an embodiment of the invention.

FIG. 10 illustrates an embodiment of a liquid confinement system 1000 that is similar to the liquid confinement system 900 of FIG. 9, but includes one or more additional and/or alternative features. As shown in FIG. 10, a deformable seal 1040 is provided between the barrier member 910 and the final element 920 of the projection system. The deformable seal 1040 may be the same type of seal as described above with reference to deformable seal 940, i.e., made from a solid flexible material, or may include a liquid. Specifically, the deformable seal 1040 may include a liquid, such as a liquid, that has suitable properties (e.g., having high surface tension) that allows the liquid to be formed into a liquid ring and also be somewhat resistant to evaporation (i.e., having low vapor pressure). For example, the deformable seal 1040 may include an oil, such as an oil that is used in vacuum pumps. One example of an oil that may be suitable is a fluoroether-based oil, such as Fomblin. Another example of a suitable liquid for the deformable seal 1040 in terms of its properties is mercury. In an embodiment, the liquid used in the deformable seal 1040 may have a low vapor pressure, e.g., a lower vapor pressure than the immersion liquid, so as not to give a significant evaporation heat load itself. In an embodiment, the deformable seal 1040 may include a liquid that is the same type of liquid that is used for the liquid 11 in the reservoir. Although the liquid may be more susceptible to evaporation than a liquid having a lower vapor pressure, any adverse effects from evaporation of the liquid in the seal, e.g. cold spots, would be located further away from the projection axis PA than cold spots that would be generated without the seal, thereby reducing the effects of the cold spots.

As shown in FIG. 10, the deformable seal 1040 may be pinned to the barrier member 910 by an energy barrier 1042, such as a recess or groove, that is located on the barrier member 910. In an embodiment, the final element 920 may also or alternatively include an energy barrier (not shown) that is located opposite the deformable seal 1040 as the energy barrier 1042 of the barrier member 910 so as to pin the deformable seal 1040 to the final element 920. In an embodiment, rather than having a recess, the energy barrier 1042 may include at least one protrusion, such as the protrusion 100 described above. The energy barrier may have any shape or configuration that is suitable to prevent the deformable seal 1040 from moving in a radially lateral direction along the horizontal surface 914 of the barrier member 910. In an embodiment, the surface 914 of the barrier member 910 may be roughened so as to create an energy barrier.

If the barrier member 910 is moved towards the final element 920, the deformable seal 1040 may be configured to deform, i.e., change shape, without breaking the overall configuration of the seal. Similar to the embodiment described above, the deformable seal 1040 may prevent an outside gas (represented by the arrow) from refreshing the gas 931 between the deformable seal 1040 and the liquid 11. This may allow the gas 931 and the liquid 11 to remain in thermal equilibrium, thereby helping to minimize evaporation of the liquid 11 due to gas flowing into the gap 930, as discussed above.

Figure 11:
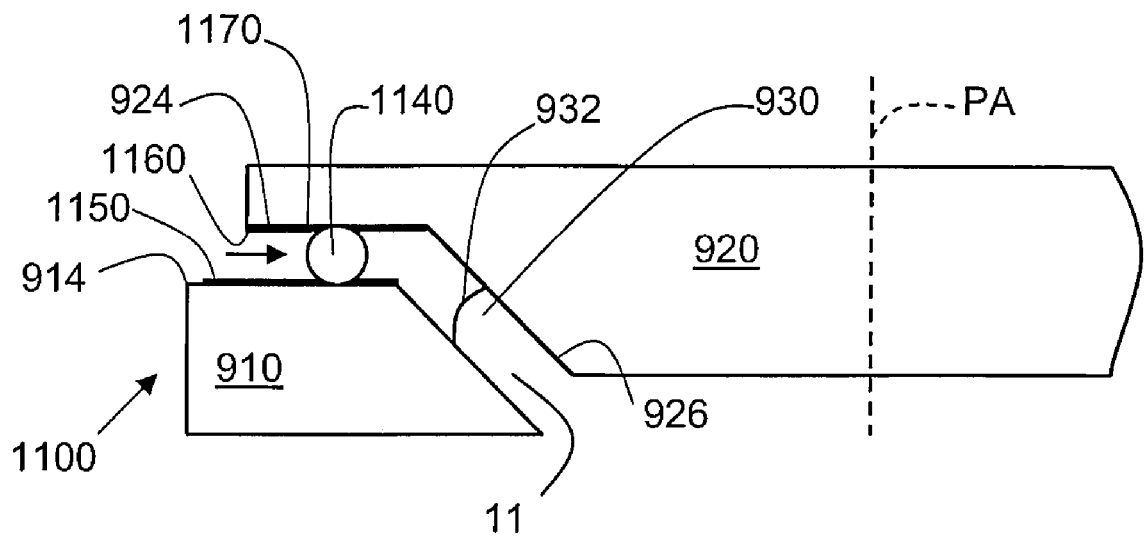
FIG. 11 depicts a cross-section of a deformable seal between the liquid confinement system and the final element according to an embodiment of the invention.

In a liquid confinement system 1100 shown in FIG. 11, a deformable seal 1140 may be pinned to the barrier member 910 with a liquid repellent (e.g., liquidphobic) external layer 1150, which may be in the form of a coating. As illustrated, the external layer 1150 may be applied to the substantially horizontal top surface 914 of the barrier member 910. The external layer 1150 may also be considered to be an energy barrier, as it will take an increase in energy to move the deformable seal 1140 out of position relative to the barrier member 910. This may be in combination with a surface step function pinning the meniscus 932 to the location of the barrier member 910 in the position shown (as described above with respect to FIGS. 7 and 8).

Figure 12:
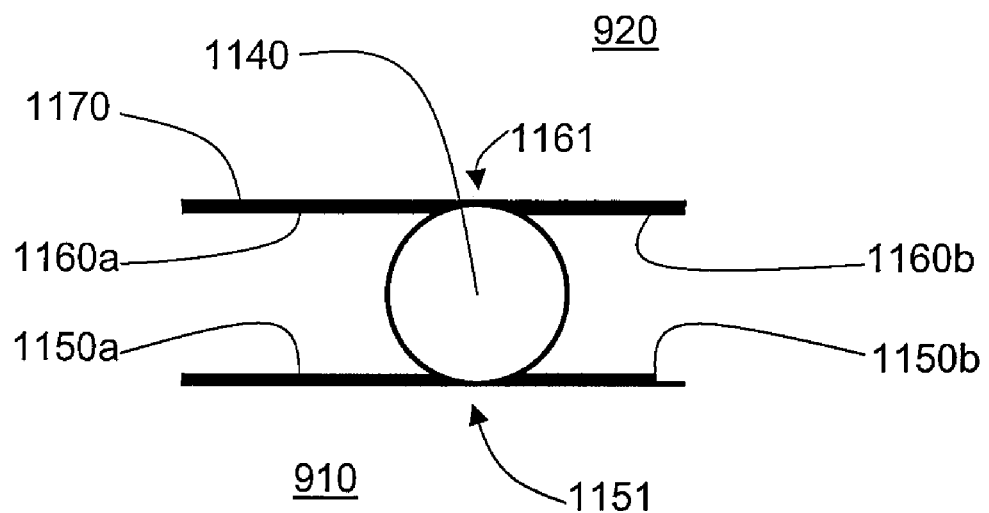
FIG. 12 depicts a detailed view of the deformable seal of FIG. 11.

FIG. 12 illustrates a more detailed view of the deformable seal 1140 of FIG. 11. As illustrated, the external layer 1150 may include a first portion 1150a and a second portion 1150b with a gap 1151 therebetween. In an embodiment, the external layer 1150 only includes one of the portions 1150a or 1150b. The gap 1151 may be sized so that the deformable seal 1140 may contact the barrier member 910 and be pinned to the opposing edges of the portions 1150a, 1150b of the external layer 1150, thereby positioning the deformable seal 1140 at the desired location relative to the projection axis PA. The surface of the barrier member 910 within the gap 1151 may have liquidphilic properties, i.e., the contact angle of the deformable seal 1150 with the gap 1151 may be less than 90 degrees but greater than 0 degrees (e.g., 80°, 70°, 60°, etc.). In an embodiment, the contact angle of the deformable seal 1140 with the gap 1151 is less than 60 degrees but greater than 0 degrees. Each side of the deformable seal 1140 may be pinned to the edges of the portions 1150a, 1150b of the external layer 1150 due to a step function change in surface properties at the edges of the portions 1150a, 1150b relative to the barrier member 910 at the gap 1151. In other words, because the contact angle between the deformable seal 1140 and the external layer 1150 is greater than 90 degrees, and the contact angle between the surface of the barrier member 910 that does not include the external layer 1150, i.e., at the gap 1151, is less than 90 degrees, a step function change in surface properties is created, and the deformable seal 1140 is not likely to move past the edges of the respective portions 1150a, 1150b. The term "edge" as used herein is intended to describe an end of the portion 1150a, 1150b of the external layer 1150 that faces the gap 1151, without imparting any particular physical structure or shape.

In addition or alternatively to the external layer 1150 of the barrier member 910, the final element 920 may have a liquidphobic external layer 1160 on the radially outer substantially horizontal surface 924, as shown in FIGS. 11 and 12. The liquidphobic external layer 1160 may be in the form of a coating. Similar to the external layer 1150 of the barrier member 910, the liquidphobic external layer 1160 of the final element 920 may include portions 1160a, 1160b that are located on opposite sides of a gap 1161, so that edges of the portions 1160a, 1160b may be used to pin the deformable seal 1140 to the final element 920 when the deformable seal 1140 is in contact with the final element 920. In an embodiment, the external layers 1150, 1160 may cover at least a portion of the respective inclined surfaces 916, 926 of the barrier member 910 and the final element 920.

The external layers 1150, 1160 may include any suitable liquidphobic material discussed above, and may be applied to their respective surfaces in the form of a coating or may be applied with a sticker or laminating material that includes such a coating. In an embodiment, the edges of the external layers 1150, 1160 may be distinct, desirably providing an abrupt discontinuity in contact angle. As discussed above, the edges may be considered as step function in the liquidphobic properties, i.e. the contact angle, of the respective surface.

In an embodiment, the edges may be defined as a gradual change in contact angle between a region that is not liquidphobic (i.e., liquidphilic) and a region that has a constant liquidphobic contact angle. For example, the edge region may have a gradually changing contact angle that increases with distance away from the respective gaps 1151, 1161. Desirably, the contact angle changes from the contact angle of the non-liquidphobic surface to the contact angle provided on the surface. The region of the surface with a gradually changing contact angle may have well-defined edges. By having well-defined edges, better control of pinning of the deformable seal 1140 may be achieved. The well-defined boundaries of the edge may be considered as a step function in the rate of change of the liquidphobic properties of the surface with displacement from the optical axis, as discussed above.

In an embodiment, a UV absorbable layer 1170 may be provided on the final element 920 in between the final element 920 and the external layer 1160. To help achieve the maximum UV protection for the external layers, and to help minimize the thermal load applied to the system through evaporation, the UV absorbent layer may cover a greater area of the final element than the external layer 1160. In an embodiment, the UV absorbable layer 1170 may be provided on the substantially horizontal surface 924, as well as the inclined surface 926 of the final element so that radiation being projected through the projection system along the projection axis does not reflect onto the external layers 1150, 1160. Of course, combinations of the external layers 1150, 1160 and energy barriers (e.g., protrusions and/or recesses) described above may be used to pin the deformable seal 1140 to the barrier member 910 and/or final element 920. In an embodiment, the external layers 1150, 1160 may be patterned so as to be annularly discontinuous.

Figure 13:
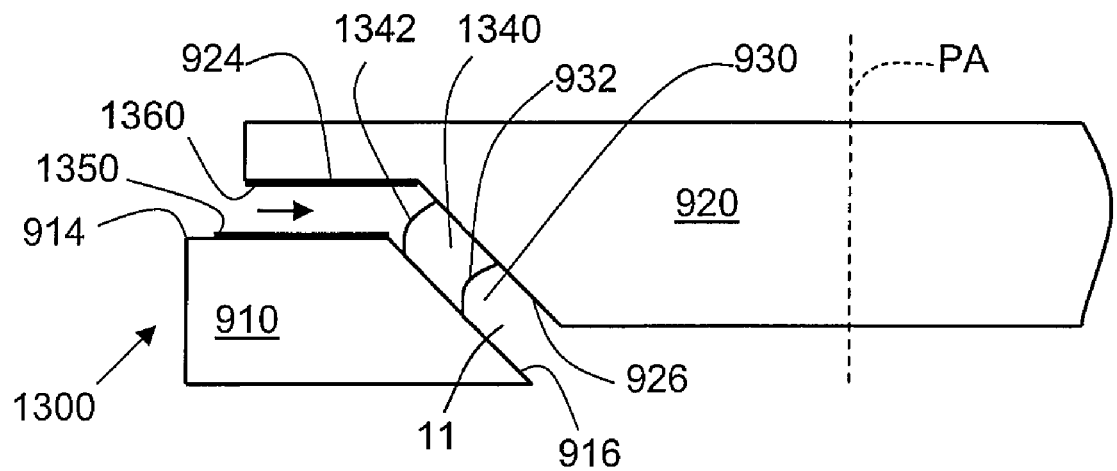
FIG. 13 depicts a cross-section of a deformable seal between the liquid confinement system and the final element according to an embodiment of the invention.

FIG. 13 illustrates an embodiment of a liquid confinement system 1300 that includes a deformable seal 1340 that is configured to prevent gas from contacting the liquid 11, thereby reducing an amount of evaporation of the liquid 11. In this embodiment, the deformable seal 1340 includes a liquid that is in direct contact with the liquid 11 from the reservoir that is in the gap 930. The liquid for the deformable seal 1340 may be selected so that it does not mix with the liquid 11 of the reservoir, i.e., the liquids are immiscible, but instead remains on top of the meniscus 932 of the liquid 11. For example, if the liquid 11 is water, the deformable seal 1340 may include a liquid having a lower density than water, such as oil. This may allow the deformable seal 1340 to float on top of the liquid 11 without mixing with the liquid 11. In addition, the deformable seal 1340 may have a low vapor pressure, and may include a low vapor pressure oil. Because the shape of the deformable seal 1340 may change as the level of the liquid 11 in the gap 930 changes and as the size of the gap 930 between the barrier member 910 and the final element 920 changes, the deformable seal 1340 may be considered to be deformable. The volume of the deformable seal 1340 may be chosen based on the level of the liquid 11 in the gap 930, as well as the desired location of a meniscus 1342 of the deformable seal 1340. In the illustrated embodiment, the meniscus 1342 of the deformable seal 1340 is located in the gap 930 between the inclined surface 916 of the barrier member 910 and the inclined surface 926 of the final element 920.

In an embodiment, a liquidphobic external layer 1350 may be provided on the barrier member 910 so that one end of the meniscus 1342 may be pinned to the barrier member 910 if the meniscus comes into contact with the external layer 1350. In addition, or alternatively, a liquidphobic external layer 1360 may be provided on the final element 920 so that the other end of the meniscus 1342 may be pinned to the final element 920. The external layers 1350, 1360 illustrated in FIG. 13 are provided only on the substantially horizontal surfaces 914, 924 of the barrier member 910 and the final element 920, respectively, which may prevent the meniscus 1342 from moving onto the substantially horizontal surface 914 of the barrier member 910 when the level of the liquid 11 within the gap rises and/or when the barrier member 910 is moved towards the final element 920. Of course, the external layers 1350, 1360 may be provided to cover at least a portion of the inclined surfaces 916, 926 as well. The external layers 1350, 1360 may be of the type discussed above. If the pressure in the liquid 11 becomes sufficiently great and/or the gap 930 between the barrier member 910 and the final element 920 becomes sufficiently small, the pressure acting on the deformable seal 1340 may be such that the meniscus 1342 becomes unpinned from the edges of the external layers 1350, 1360. In an embodiment, the external layers 1350, 1360 may not be used at all.

Figure 14:
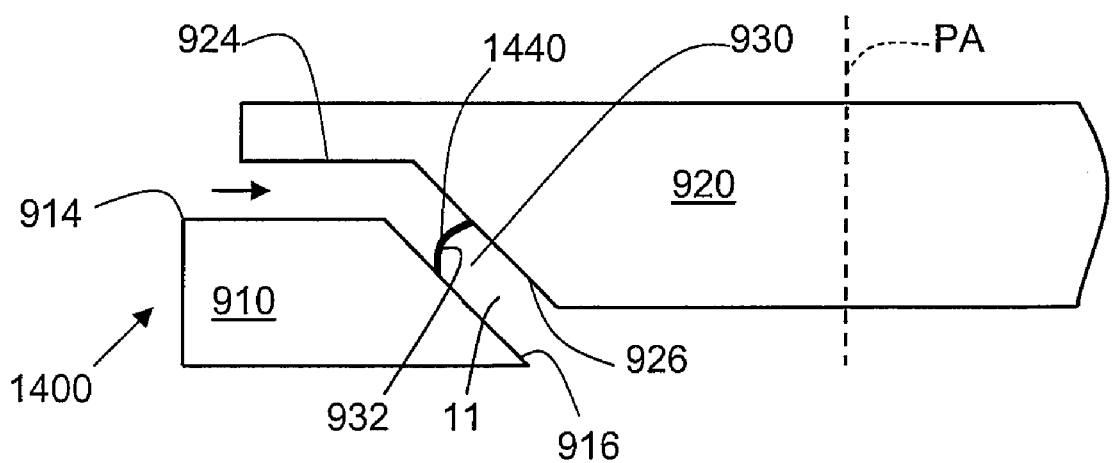
FIG. 14 depicts a cross-section of a deformable seal between the liquid confinement system and the final element according to an embodiment of the invention.

FIG. 14 illustrates an embodiment of a liquid confinement system 1400 that includes a deformable seal 1440 that is also in direct contact with the meniscus 932 of the liquid 11. The deformable seal 1440 may include a thin foil that is configured to float on top of the liquid 11. The deformable seal 1440 may be configured to assume the shape of the meniscus 932, even when the shape of the meniscus 932 changes as the level of the liquid 11 rises and falls within the gap 930. In an embodiment, small gaps may exist between the deformable seal 1440 and the meniscus 932. In such an embodiment, the gas within the small gaps may become saturated with vapor from the liquid 11. The deformable seal 1440 may prevent fresh gas, such as air, from reaching the small gaps, thereby helping to minimize the amount of evaporation of the liquid 11 due to contact with the fresh gas. Although the deformable seal 1440 may form a gas tight seal, the seal need not be gas tight while still functioning to substantially prevent the outside gas from contacting the liquid and causing the liquid to evaporate.

In any of the embodiments discussed above, the barrier member 910 and/or final element 920 may include a liquidphobic external layer of the type discussed above with respect to the embodiments illustrated in FIGS. 7 and 8, and as described in U.S. Patent Application No. 60/935,247, filed Aug. 2, 2007 and incorporated herein in its entirety by reference. By pinning the meniscus of the liquid to a desired location within the gap, evaporation of the liquid 11 may be further reduced.

Figure 5:
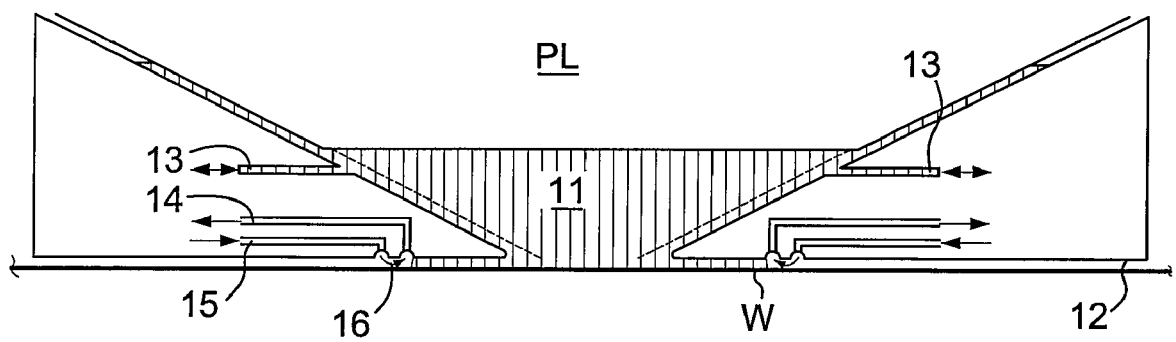
FIG. 5 depicts, in cross-section, a liquid supply system for use in a lithographic apparatus.

Embodiments of the deformable seal, as described above, may also be used in other locations of the lithographic apparatus, for example, where it is desirable to prevent evaporation of the liquid at a meniscus. For example, although the embodiments above describe the deformable seal as being located on top of the horizontal surface of the barrier member, it is also contemplated that the deformable seal may be used at a location below the barrier member. In an embodiment, the deformable seal may be located in between the barrier member and the substrate table and/or the substrate at a position that is radially outward of the gas seal 16 shown in FIG. 5, for example. The illustrated embodiments are not intended to be limiting in any way.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography, a topography in a patterning structure defines the pattern created on a substrate. The topography of the patterning structure may be pressed into a layer of resist supplied to the substrate whereupon the resist is cured by applying electromagnetic radiation, heat, pressure or a combination thereof. The patterning structure is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams. The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media. One or more controllers may be provided to control the apparatus. The controllers may operate the apparatus according to the one or more computer programs embodying the invention.

One or more embodiments of the invention may be applied to any immersion lithography apparatus, in particular, but not exclusively, those types mentioned above and whether the immersion liquid is provided in the form of a bath, or only on a localized surface area of the substrate, or is unconfined. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion liquid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other feature of the liquid. The one or more controlling elements can be provided to control the apparatus. The controller may have a processor which may operate to execute the one or more computer programs.

The immersion liquid used in the apparatus may have different compositions, according to the desired properties and the wavelength of exposure radiation used. For an exposure wavelength of 193 nm, ultra pure water or water-based compositions may be used and for this reason the immersion liquid is sometimes referred to as water and water-related terms such as hydrophilic, hydrophobic, humidity, etc. may be used, although they should be considered more generically. It is intended that such terms should also extend to other high refractive index liquids which may be used, such as fluorine containing hydrocarbons.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
a projection system configured to project a patterned radiation beam onto a target portion of a substrate, the projection system having a final element;
a barrier member surrounding a space between the projection system and, in use, the substrate, to define in part with the final element a reservoir for liquid, the barrier member being spaced from the final element to define a gap therebetween; and
a deformable seal between a radially outer surface of the final element and a radially outer surface of the barrier member, the deformable seal being configured to substantially prevent a gas from flowing past the seal towards or away from the reservoir of liquid and configured to allow fluid to pass the seal when liquid is between the radially outer surface of the final element and the radially outer surface of the barrier member, wherein the deformable seal is located between a substantially horizontal surface of the barrier member and a substantially horizontal surface of the final element.

2. The lithographic apparatus of claim 1, wherein the deformable seal comprises a resilient and/or flexible material.

3. The lithographic apparatus of claim 1, wherein the deformable seal is substantially annular-shaped.

4. The lithographic apparatus of claim 1, wherein the deformable seal comprises a flexible material configured to, in use, be in contact with the liquid.

5. The lithographic apparatus of claim 1, wherein a top surface of the barrier member comprises a recess constructed and arranged to receive at least a portion of the deformable seal.

6. The lithographic apparatus of claim 1, wherein the deformable seal is not in contact with the final element during normal operation of the apparatus.

7. The lithographic apparatus of claim 1, wherein the deformable seal comprises a compressible member constructed and arranged to be compressed relative to the barrier member and the final element upon upward movement of the barrier member relative to the final element.

8. The lithographic apparatus of claim 1, wherein the deformable seal is spaced from the liquid and wherein a gas having a high partial pressure of inert gas and a low partial pressure of oxygen is located between the deformable seal and the liquid.

9. The lithographic apparatus of claim 8, wherein the inert gas comprises nitrogen.

10. The lithographic apparatus of claim 1, wherein the barrier member or the final element comprise an energy barrier to pin the deformable seal to the barrier member or the final element respectively.

11. A device manufacturing method comprising:
projecting a patterned beam of radiation from a projection system through an immersion liquid onto a target portion of a substrate;
confining the immersion liquid in a space between the projection system and the substrate using a final element of the projection system and a barrier member surrounding the space;
substantially preventing a gas from flowing past a deformable seal between a radially outer surface of the final element and a radially outer surface of the barrier member, the deformable seal located between a substantially horizontal surface of the barrier member and a substantially horizontal surface of the final element; and
allowing fluid to pass the seal when immersion liquid is between the radially outer surface of the final element and the radially outer surface of the barrier member.

12. The device manufacturing method of claim 11, wherein the deformable seal comprises a flexible material configured to compress when the barrier member moves upwardly towards the final element.

13. The device manufacturing method of claim 11, wherein the immersion liquid contacts with a solid flexible material.

14. The device manufacturing method of claim 11, wherein the deformable seal is spaced from the immersion liquid, and wherein the method further comprises providing a gas having a high partial pressure of inert gas and a low partial pressure of oxygen in between the deformable seal and the immersion liquid.

15. A lithographic apparatus comprising:
a projection system configured to project a patterned radiation beam onto a target portion of a substrate, the projection system having a final element;
a barrier member surrounding a space between the projection system and, in use, the substrate, to define in part with the final element a reservoir for liquid, the barrier member being spaced from the final element to define a gap therebetween; and
a deformable seal between a radially outer surface of the final element and a radially outer surface of the barrier member, the deformable seal being configured to substantially prevent a gas from entering or leaving the gap between the final element and the barrier member and configured to be bypassed by liquid in the gap or to be displaced by liquid in the gap from its position contacting the final element and the barrier member, wherein the deformable seal is located between a substantially horizontal surface of the barrier member and a substantially horizontal surface of the final element.

16. The lithographic apparatus of claim 15, wherein the deformable seal comprises a resilient and/or flexible solid material.

17. The lithographic apparatus of claim 15, wherein the deformable seal is spaced from the liquid and wherein a gas having a high partial pressure of inert gas and a low partial pressure of oxygen is located between the deformable seal and the liquid.

18. The lithographic apparatus of claim 15, wherein a top surface of the barrier member comprises a recess constructed and arranged to receive at least a portion of the deformable seal.

* * * * *